United States Patent [19]

Buhl et al.

[11] 4,279,216
[45] Jul. 21, 1981

[54] CATHODE SHIELDED COATING APPARATUS

[75] Inventors: Rainer Buhl, Sargans; Hans Signer, Oberschaan, both of Switzerland

[73] Assignee: Balzers Aktiengesellschaft für Hochvakuumtechnik und Dünne Schichten, Liechtenstein

[21] Appl. No.: 115,729

[22] Filed: Jan. 28, 1980

[30] Foreign Application Priority Data

Feb. 1, 1979 [CH] Switzerland ................. 1182/79

[51] Int. Cl.³ ............................................ C23C 13/03
[52] U.S. Cl. ................................... 118/723; 204/298
[58] Field of Search ................. 118/722–725, 118/715; 427/38–41; 204/298, 192 N

[56] References Cited

U.S. PATENT DOCUMENTS

| 3,437,734 | 4/1969 | Roman et al. ................. 118/723 X |
| 3,507,248 | 4/1970 | Seeley et al. ..................... 118/723 |
| 3,900,585 | 8/1975 | Matsubara ..................... 427/39 X |
| 4,013,533 | 3/1977 | Solal et al. .................. 204/298 X |
| 4,038,171 | 7/1977 | Moss et al. ........................ 204/298 |
| 4,098,919 | 7/1978 | Morimoto et al. ............. 204/192 N |

*Primary Examiner*—Morris Kaplan
*Attorney, Agent, or Firm*—McGlew and Tuttle

[57] ABSTRACT

A vacuum evaporator includes a housing defining a vacuum chamber which has a mounting for an evaporative material and an electrode spaced from the evaporative material which is arranged adjacent the support for a substrate to be coated. A screening element is located between the electrode and the substrate support in the vacuum chamber. The vacuum chamber has a gas inlet port through which gases may be passed.

12 Claims, 6 Drawing Figures

CATHODE SHIELDED COATING APPARATUS

FIELD AND BACKGROUND OF THE INVENTION

The invention relates in general to evaporators and in particular to a new and useful vacuum evaporator comprising a device for producing a d.c. current glow discharge which is intended for treating substrate surfaces to be coated. Such a treatment may be useful as a preparatory measure for vapor deposition onto the substrate, or during the vapor deposition, or even for subsequent treatment of the deposited layer.

Cleaning of the substrate surfaces prior to the vapor deposition is an example of such treatments. Aside from the mostly chemical cleaning methods applied before the substrates are placed in the vacuum chamber, a cleaning by cathode sputtering immediately prior to the coating or even a continuous cleaning during the coating, particularly in the initial phase of deposition, have proved very satisfactory, because such cleaning results in unusually well adhering layers. In the process, the negative pole of a d.c. voltage source is applied to the substrates and the pressure of the residual gas is adjusted to obtain a mean free length of path of the gas molecules between two consecutive collisions in the gas space, equal to about 1/30 to 1/100 of the distance by which the substrates are spaced from the opposite wall of the container. In the cathode drop region having a thickness of about 20 mean free lengths of path and where almost the entire discharge potential difference drop occurs, the formed ions are accelerated toward the cathode, impinge on the substrates and remove, by sputtering, first the contaminating matter and then also the uppermost surface layers, with the atoms sputtered away diffusing into the residual gas of the vacuum chamber and being flushed out by a gas stream. In this process, the positively charged gas ions discharge on the substrate and the corresponding electric current must be carried away, so that the application of the method is substantially limited to a cleaning of electrically conducting substrates.

To apply the method to non-conducting substrates, it is known to replace the d.c. voltage source by a high-frequency source, however, this requires more expensive equipment. It has further been provided to enclose the insulating substrates into a net or to dispose them behind a grate to which a negative d.c. voltage is applied. This, however, cannot prevent a simultaneous undesirable contamination of the substrate surface with the metal of which the net or grate is made, since these metal parts effective now as a cathode are also subjected to sputtering and the metal atoms sputtered off are partly precipitated on the substrate surface. It is true that this might not be disturbing if metal layers are to be deposited on the substrates. However, if transparent layers, for example anti-reflection layers on lenses, are to be deposited, such an advance coating with a metal is unacceptable. For these reasons the cleaning of non-conducting substrates by cathode sputtering has not been too practical, in spite of the better adhesion of the layers obtainable in this way.

Instead, another cleaning method is frequently used operated with a geometrical arrangement quite differing from that described above, namely a glow discharge, with the potential being applied to the substrates which, along with the wall of the container, form the anode on which the electrons impinge. Here, contrary to a cleaning by cathode sputtering, the again negatively polarized cathode is spaced from the substrates by many mean free lengths of path. However, the electrons impinging on the substrate surface in accordance with this method only effect the desorption of weakly bonded adsorbed substances, and no sputtering of firmly adhering surface layers. With the glow discharge arrangement, the substrates are cleaned in a gentle way, however, as mentioned, with an only moderate effect. In addition, with this method again, metal is sputtered from the cathode (glow electrode) only; and, since the substrates are spaced from the cathode by many mean free lengths of path, relatively few metal atoms sputtered from the cathode reach the substrate surface. Thus with the glow discharge method, in many applications, the contamination of the surface is not perceptible.

Another method in which the substrates are treated by means of an electric discharge is known as the "ion plating" or "ion-supported vapor deposition". What is important in this method is not only the continuous removal of contaminating matter during the condensation of the layer through ion bombardment, but still more the fact that energy is transferred by the ions to the surface to be coated, whereby the adhesive strength is furthered. This energy transfer may be effected either directly by the impinging ions, or indirectly, if the energy is first transferred to colliding neutral molecules (of the residual gas atmosphere, or of the vapor of the material to be condensed) and therefrom to the substrate surface. Such an energy transfer may be desirable even for an after-treatment of a layer, for example, to make it harder and more resistant to external effects, or to induce a chemical reaction, for example, oxidation of the layer in a suitable reactive atmosphere.

SUMMARY OF THE INVENTION

The present invention is directed to a vacuum evaporator permitting a treatment, preferably cleaning of the substrate surface, primarily with neutral particles. This vacuum evaporator comprises a housing which encloses an evaporative chamber in which there is placed a support for an evaporative substance which is heated by an electrical heater. A support is supplied for the substrates to be coated which is located in space relationship to the evaporative material and it is advantageously connected to means for rotating it. One or more electrodes are spaced from the support located between the support and the evaporative source. In addition, screening elements are located between the electrodes and the substrate support in a position to prevent a direct optical path between the electrodes and the substrate surfaces to be coated.

Accordingly, it is an object of the invention to provide a vacuum evaporator which comprises wall means which define a vacuum chamber having a gas inlet port and including therein an evaporative source and a supporting structure for the substrate to be coated spaced from the evaporative source and with one or more electrodes located between the substrate support and the evaporative source, each of which has a screened element therebetween in such a position that a direct optical path between the electrode and the substrate surfaces is interrupted.

A further object of the invention is to provide a vacuum evaporator which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
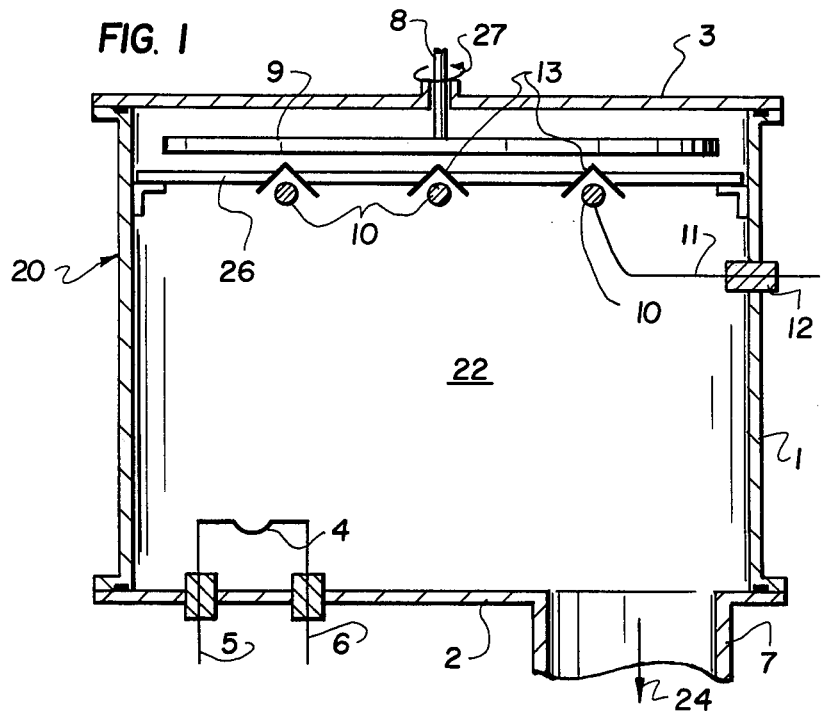
FIG. 1 is partial sectional view of a vacuum evaporator constructed in accordance with the invention.

Referring to the drawings, in particular the invention embodied therein comprises a vacuum evaporator generally designated 20 which includes a housing defining an interior vacuum chamber 22.

According to FIG. 1 the housing 20 has a cylindrical wall 1 surrounding a vacuum chamber 22 which is closed on its top and bottom side by a bottom plate 2 and a cover plate 3 respectively. The chamber 22 accommodates a diagrammatically indicated evaporant source 4 which is supplied with heating current by connections extending through vacuum-tight leads 5 and 6. The chamber 22 is evacuated in the direction of arrow 24 through an exhaust connection 7. A drive shaft 8 is centrically and hermetically passed through cover plate 3 and carries a supporting plate 9 for supporting one or more substrates to be coated.

During the vapor deposition the supporting plate 9 is rotated by the shaft 8 to make the coating of the substrate areas facing the evaporative source as uniform as possible. A latticed or open-worked electrode 10, for example, in the form of a plurality of parallel grate bars which are electrically connected to each other and supplied through a lead 11 passing at 12 through the chamber wall to the outside, is provided between the evaporant source 4 and the substrates and a potential, negative relative to evaporant source 4, may be applied thereto, i.e, it may be connected as a cathode. Electrode 10 should be spaced from the substrates by a distance in the order of magnitude of a few mean free lengths of path of the gas molecules at operating pressures in the vacuum chamber.

In accordance with the invention, angular screening elements 13 are provided between electrode bars 10 and the substrate surfaces, having the effect of interrupting the direct optical path between electrode 10 and the substrate surfaces. What is thereby obtained is that the metal atoms which may be sputtered off the cathodically connected electrode 10 cannot reach the substrate surfaces; the neutral particles, however, struck by the ions which are accelerated by the electric field, pass through the space between electrode bars 10 to the substrate surface and while transferring thereto their kinetic energy, continuously clean the surfaces during the coating process and increase the adhesive strength of the deposited layers. Preferably, as shown in the Figure, screening elements 13 are electrically connected to chamber wall 1 by a plate 26.

Instead of electrodes formed by grate bars as shown and mentioned, another design of an open-worked electrode may be provided, such as a net or a perforated sheet, known per se, only it must be ensured that the apertures are sufficiently numerous and large to obtain on the substrates the desired deposit in the desired distribution. To obtain a uniform distribution, it is advisable to set the substrate support 9 in rotary motion during the vapor deposition, by means of the shaft 8, as indicated by the arrow 26 in FIG. 1. Motion of the electrode and of the screens relative to the substrate may also serve the purpose of a uniform distribution of the condensate.

Electrode 10 and the associated screening elements 13 may be mechanically connected to each other, however, they must be electrically insulated from each other.

Figure 2A:
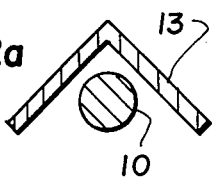
FIG. 2a is an enlarged sectional view of the construction of the electrode and the screening element therefor.
Figure 2B:
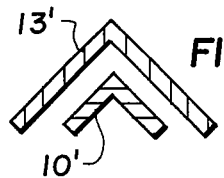
FIGS. 2b, 2c, 2d and 2e are views similar to FIG. 2a of other embodiments of the invention.

FIGS. 2a and 2b show practical sections of electrode bars 10 and screening elements 13. The screening element associated with an individual electrode bar may extend thereover as a roof. The shapes of electrodes 10, 10' etc. and elements 13, 13' etc. according to FIGS. 2c and 2e are particularly advantageous.

Figure 2C:
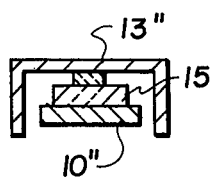
Figure 2D:
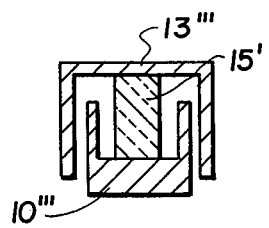
Figure 2E:
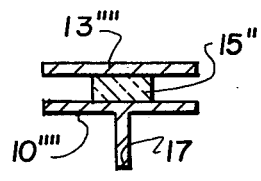

In FIGS. 2c to 2e, the cathodically connectable electrode 10" is shown with different cross sections. Through respective insulators 15, 15' and 15" the electrode supports screening element 13", 13''' and 13''''. The mechanical connection between these parts may be of any known kind suitable for being used under vacuum.

Particularly advantageous is the embodiment of FIG. 2e with the T-shaped section of the electrode bars 10'''', having an edge 17 turned to the evaporative source. This has the effect of distributing the electric field in such a way that the ions to be kept away from the substrate surfaces are directed predominantly toward said edge while the fast neutral particles struck or produced (by collision or charge exchage) by the ions effect etching at a high rate. The high ionic density at the projecting edge 17 has the effect that the edge maintains its function as cathode of the discharge even if electrically insulating substances are deposited at high coating rates, because the ion layer growing up on the edge is sputtered off by the discharge itself. In addition, the T-section provides a mechanically stable structure. The embodiments of FIGS. 2c to 2e have the further advantage that the insulators 15, 15' and 15", supporting the screening elements are protected by the electrode against vapor deposition.

While specific embodiments of the invention have been shown and described in detail to illustrate the application of the principles of the invention, it will be understood that the invention may be embodied without departing from such principles.

What is claimed is:

1. A vacuum evaporator comprising wall means defining a vacuum chamber, a gas inlet port connected to said chamber for the inlet of gas molecules into said chamber, an evaporant source arranged in said chamber, a supporting structure spaced from said evaporant source in said chamber having means for mounting at least one substrate to be coated, at least one electrode connected as a cathode and adapted for cleaning a substrate to be coated, said cathode being disposed directly in front of and generally spaced about a few mean free lengths of the path of the gas molecules at operating pressure from said substrate surfaces to be coated spaced from said evaporant source, and a screening element provided in said chamber between said electrode and said substrate surface in such a position that any direct optical path between the electrode and the substrate surface is interrupted.

2. A vacuum evaporator according to claim 1 wherein said wall means includes a wall conductively connected to said screening element.

3. A vacuum evaporator according to claim 1 wherein said wall means includes a wall defining said vacuum chamber, said electrode being electrically insulated from said wall and being supported by said screening element.

4. A vacuum evaporator according to claim 1 wherein said electrode comprises a bar member of T-shaped cross section.

5. A vacuum evaporator according to claim 1 wherein said screening element comprises a bar member disposed adjacent said electrode, support means supporting said bar member including an insulator, said electrode being shaped to protect that insulator against vapor deposition.

6. A vacuum evaporator according to claim 1 wherein said substrate support comprises a rotatable member having a support surface for a plurality of substrates, said at least one electrode comprising a plurality of electrodes extending across said chamber between said support surface and evaporative source, said screening element comprising a separate screening element for each electrode having portions extending on each side of said electrode and between said electrode and said support surface.

7. A vacuum evaporator according to claim 6 wherein said screening element is of angular configuration.

8. A vacuum evaporator according to claim 7 wherein said electrode is of an angular configuration similar to the angular configuration of said screening element and is nested within said screening element.

9. A vacuum evaporator according to claim 6 wherein said screening element comprises a U-shaped member, said electrode being arranged within said U-shaped member an insulator disposed between said electrode and said U-shaped member.

10. A vacuum evaporator according to claim 9 wherein said electrode is also of U-shaped configuration and is arranged within and is opposite to U-shaped configuration of said screening element.

11. A vacuum evaporator according to claim 6 wherein said screening element comprises a plate member having a flat surface, said electrode comprising a T-shaped member having one flat surface opposed to said plate surface and an insulator disposed between said one surface and said plate surface.

12. A vacuum evaporator according to claim 11 wherein said electrode includes a leg portion extending outwardly from said plate portion in a direction opposite to said screening element.

* * * * *